United States Patent
Shen et al.

(10) Patent No.: US 7,851,270 B2
(45) Date of Patent: *Dec. 14, 2010

(54) MANUFACTURING PROCESS FOR A CHIP PACKAGE STRUCTURE

(75) Inventors: Geng-Shin Shen, Tainan County (TW); Chun-Ying Lin, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 169 days.

This patent is subject to a terminal disclaimer.

(21) Appl. No.: 12/270,602

(22) Filed: Nov. 13, 2008

(65) Prior Publication Data

US 2009/0068792 A1    Mar. 12, 2009

Related U.S. Application Data

(63) Continuation-in-part of application No. 11/326,749, filed on Jan. 5, 2006, now Pat. No. 7,560,306.

(30) Foreign Application Priority Data

Jul. 21, 2005    (TW) ............................... 94124656 A

(51) Int. Cl.
    *H01L 21/44* (2006.01)
(52) U.S. Cl. ............... 438/126; 257/686; 257/E21.499; 438/108; 438/617
(58) Field of Classification Search ............... 257/686, 257/E21.499; 438/108, 109, 126, 617
    See application file for complete search history.

(56) References Cited

U.S. PATENT DOCUMENTS

| 6,001,671 | A  | 12/1999 | Fjelstad |
| 6,448,506 | B1 | 9/2002  | Glenn et al. |
| 7,091,581 | B1 | 8/2006  | McLellan et al. |
| 2002/0039808 | A1 | 4/2002 | Fukutomi et al. |
| 2006/0223234 | A1 | 10/2006 | Terayama et al. ........... 438/113 |

FOREIGN PATENT DOCUMENTS

CN    1501488    6/2004

OTHER PUBLICATIONS

U.S. Office Action of U.S. Appl. No. 11/326,749, dated Dec. 5, 2008.

*Primary Examiner*—Asok K Sarkar
(74) *Attorney, Agent, or Firm*—J.C. Patents

(57) ABSTRACT

A manufacturing process for a chip package structure is provided. First, a patterned conductive layer having a plurality of first openings and a patterned solder resist layer on the patterned conductive layer are provided. A plurality of chips are bonded onto the patterned conductive layer such that the chips and the patterned solder resist layer are disposed at two opposite surfaces of the patterned conductive layer. The chips are electrically connected to the patterned conductive layer by a plurality of bonding wires passing through the first openings of the patterned conductive layer. At least one molding compound is formed to encapsulate the patterned conductive layer, the patterned solder resist layer, the chips and the bonding wires. Then, the molding compound, the patterned conductive layer and the patterned solder resist layer are separated.

15 Claims, 4 Drawing Sheets

MANUFACTURING PROCESS FOR A CHIP PACKAGE STRUCTURE

CROSS-REFERENCE TO RELATED APPLICATION

This application is a continuation-in-part of U.S. application Ser. No. 11/326,749, filed Jan. 5, 2006, all disclosure is incorporated therewith. The prior application Ser. No. 11/326,749 claims the priority benefit of Taiwan application serial no. 94124656, filed on Jul. 21, 2005. The entirety of each of the above-mentioned patent applications is hereby incorporated by reference herein and made a part of this specification.

BACKGROUND OF THE INVENTION

1. Field of the Invention

The present invention relates to a manufacturing process for a chip package structure. More particularly, the present invention relates to a manufacturing process for a chip package structure having small thickness.

2. Description of Related Art

In the industry of the semiconductor, the production of integrated circuits (IC) can be mainly divided into three stages: IC design, IC fabrication process and IC package.

During the IC fabrication process, a chip is fabricated by the steps such as wafer process, IC formation and wafer sawing. A wafer has an active surface, which generally means the surface that a plurality of active devices is formed thereon. After the IC within the wafer is completed, a plurality of bonding pads are further formed on the active surface of the wafer so that the chip formed by wafer sawing can be electrically connected to a carrier through the bonding pads. The carrier may be a lead frame or a circuit board. The chip can be electrically connected to the carrier by wire bonding or flip chip bonding, so that the bonding pads on the chip are electrically connected to connecting pads of the carrier, thereby forming a chip package structure.

In general, in the manufacturing method of the conventional circuit board, a core dielectric layer is necessarily required, the patterned circuit layer and the patterned dielectric layer are inter-stacked on the core dielectric layer in a fully additive process, semi-additive process, subtractive process or other suitable process. Accordingly, the core dielectric layer may take a major proportion in the entire thickness of the circuit board. Therefore, if the thickness of the core dielectric layer can not be reduced effectively, it would be a big obstacle in reducing the thicknesses of the chip package.

SUMMARY OF THE INVENTION

The present invention is to provide a manufacturing process for a chip package structure with thinner thickness.

As embodied and broadly described herein, the present invention provides a manufacturing process for a chip package structure. First, a patterned conductive layer having a plurality of first openings and a patterned solder resist layer on the patterned conductive layer are provided. A plurality of chips are bonded onto the patterned conductive layer such that the chips and the patterned solder resist layer are disposed at two opposite surfaces of the patterned conductive layer. The chips are electrically connected to the patterned conductive layer by a plurality of bonding wires passing through the first openings of the patterned conductive layer. At least one molding compound is formed to encapsulate the patterned conductive layer, the patterned solder resist layer, the chips and the bonding wires. Then, the molding compound, the patterned conductive layer and the patterned solder resist layer are separated.

According to an embodiment of the present invention, a method for providing the patterned conductive layer and the patterned solder resist layer includes providing a conductive layer, forming a solder resist layer on the conductive layer, patterning the solder resist layer to form the patterned solder resist layer such that a part of the conductive layer is exposed by the patterned solder resist layer, and patterning the conductive layer to form the patterned conductive layer.

According to an embodiment of the present invention, a method for providing the patterned conductive layer and the patterned solder resist layer includes providing a solder resist layer, forming a conductive layer on the solder resist layer, patterning the solder resist layer to form the patterned solder resist layer such that a part of the conductive layer is exposed by the patterned solder resist layer, and patterning the conductive layer to form the patterned conductive layer.

According to an embodiment of the present invention, a method for providing the patterned conductive layer and the patterned solder resist layer includes providing a conductive layer, forming a solder resist layer on the conductive layer, patterning the conductive layer to form the patterned conductive layer, and patterning the solder resist layer to form the patterned solder resist layer such that a part of the patterned conductive layer is exposed by the patterned solder resist layer.

According to an embodiment of the present invention, a method for providing the patterned conductive layer and the patterned solder resist layer includes providing a solder resist layer, forming a conductive layer on the solder resist layer, patterning the conductive layer to form the patterned conductive layer, and patterning the solder resist layer to form the patterned solder resist layer such that a part of the patterned conductive layer is exposed by the patterned solder resist layer.

According to an embodiment of the present invention, a plurality of leads are formed by patterning the conductive layer.

According to an embodiment of the present invention, a plurality of second openings are formed on the patterned solder resist layer, wherein a part of the patterned conductive layer and a part of each of the chips are exposed by the second openings.

According to an embodiment of the present invention, a plurality of third openings are formed on the patterned solder resist layer.

According to an embodiment of the present invention, the manufacturing process for a chip package structure further includes forming an outer terminal in each of the third openings and then electrically connecting the outer terminals to the patterned conductive layer through the third openings.

According to an embodiment of the present invention, the manufacturing process for a chip package structure further includes forming an adhesive layer between the chips and the patterned conductive layer.

According to an embodiment of the present invention, the adhesive layer is a B-staged adhesive layer.

According to an embodiment of the present invention, the B-staged adhesive layer is formed on a rear surface of the chip in advance.

According to an embodiment of the present invention, the B-staged adhesive layer is formed on the patterned conductive layer before the chip is attached on the patterned conductive layer.

According to an embodiment of the present invention, the chip is partially encapsulated by the molding compound.

According to an embodiment of the present invention, the chip is entirely encapsulated by the molding compound.

In summary, since the manufacturing process for the chip package structure of the present invention can produce the chip package without core dielectric layer, the manufacturing process for the chip package structure of the present invention can produce the chip package has thinner thickness than the conventional chip package.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
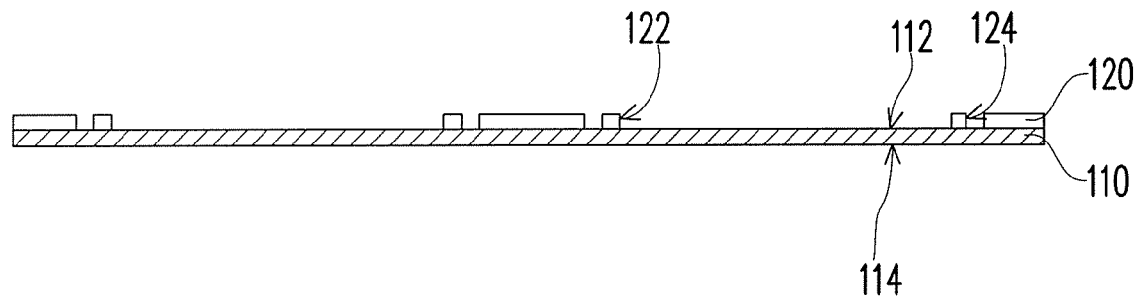
FIG. 1A to FIG. 1H are cross-sectional views schematically illustrating the manufacturing process for the chip package structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1H are cross-sectional views schematically illustrating the manufacturing process for the chip package structure according to an embodiment of the present invention. Referring to FIG. 1A, a conductive layer 110 and a patterned solder resist layer 120 are provided, wherein the conductive layer 110 has a first surface 112 and a second surface 114 opposite to each other, and the patterned solder resist layer 120 has a plurality of second openings 122 and a plurality of third openings 124. Additionally, the patterned solder resist layer 120 is disposed on the first surface 112 of the conductive layer 110, wherein a part of the first surface 112 is exposed by the patterned solder resist layer 120. In a preferred embodiment, a brown oxidation or a black oxidation process can further be performed on the conductive layer 110 to improve the surface roughness of the conductive layer 110. Accordingly, the combination between the conductive layer 110 and the patterned solder resist layer 120 is improved.

In the present embodiment, the patterned solder resist layer 120 may be provided by attaching a B-staged film, which is also a solder resist film, onto the first surface 112 of the conductive layer 110 first, and the solid solder resist film may be patterned to form the patterned solder resist layer 120 before or after being attached onto the conductive layer 110. In an alternative embodiment, the patterned solder resist layer 120 may be formed by coating a liquid solder resist on the first surface 112 of the conductive layer 110 first, and the liquid solder resist should be cured and patterned to form the patterned solder resist layer 120 after being coated on the first surface 112 of the conductive layer 110 and the liquid solder resist could be a B-staged liquid solder resist. In this embodiment, the patterned solder resist layer 120 could be a B-staged film. Furthermore, the patterned solder resist layer 120 could be a B-staged film which is photosensitive.

Figure 1B:
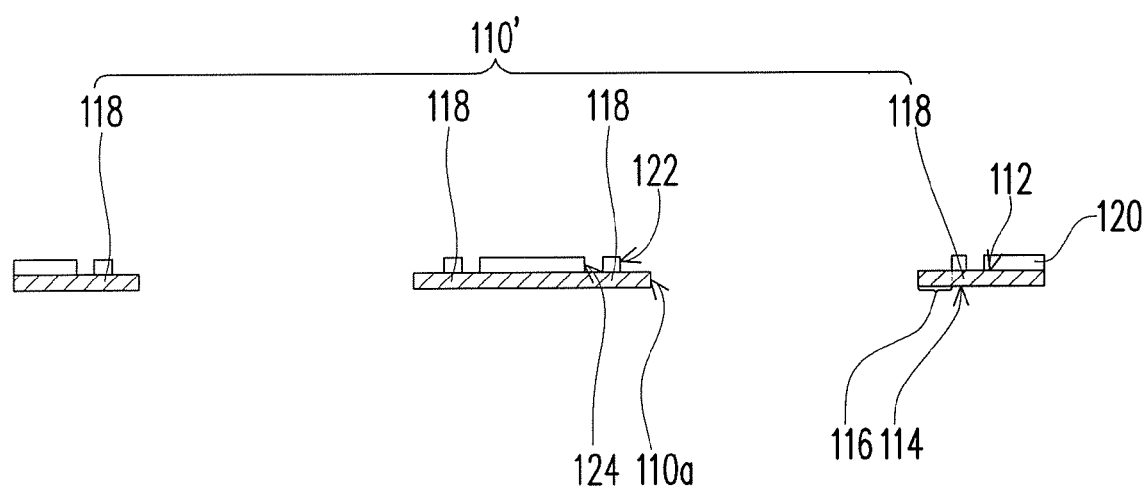

Referring to FIG. 1B, the conductive layer 110 is then patterned to form a patterned conductive layer 110' having a plurality of first openings 110a through a photolithography and etching process, wherein the patterned conductive layer 110' has a plurality of leads 118 and a part of the first surface 112 of the patterned conductive layer 110' is exposed by the patterned solder resist layer 120. In other words, a plurality of first bonding pads 116 are defined by the patterned solder resist layer 120 formed on a part of the first surface 112. It is noted that sequence of the patterning processes for forming the patterned conductive layer 110' and the patterned solder resist layer 120 is not limited in the present invention. In a preferred embodiment, a plating process may be performed so as to form plating conductive layer (not shown) on the first bonding pads 116. The plating conductive layer may be a Ni/Au stacked layer, or other suitable metal layers.

Figure 1C:
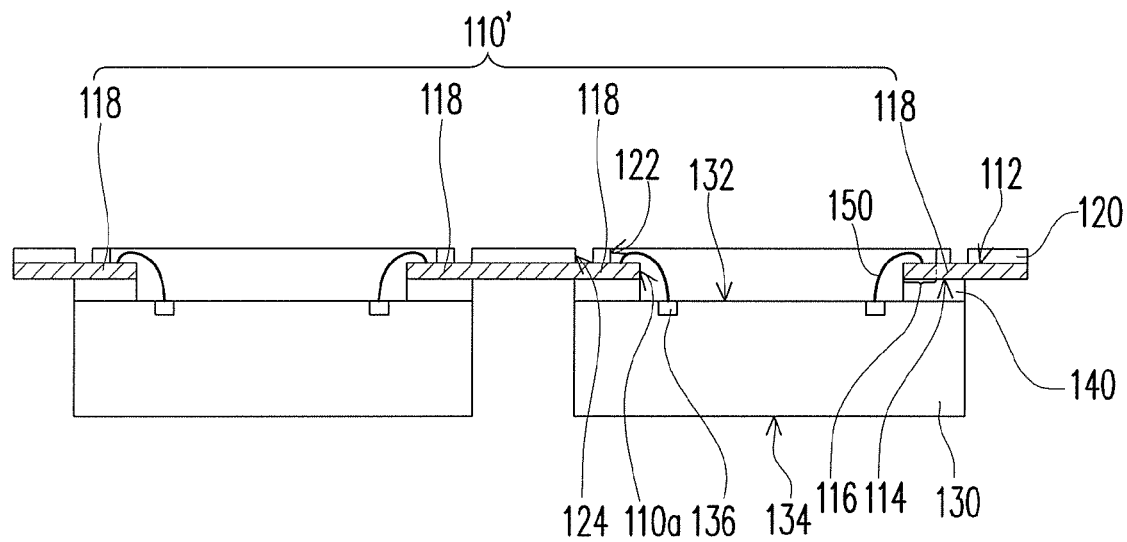

Referring to FIG. 1C, a plurality of chips 130 are adhered to the patterned conductive layer 110' and a plurality of bonding wires 150 passing through the first openings 110a are then formed to connect the first bonding pads 116 and the chips 130, wherein each chip 130 has an active surface 132, a rear surface 134 opposite to the active surface 132 and a plurality of second bonding pads 136 disposed on the active surface 132, and the second bonding pads 136 are exposed by one second opening 122. Each chip 130 is adhered with the patterned conductive layer 110' by an adhesive layer 140 between the chip 130 and the patterned conductive layer 110'.

In the present embodiment, the bonding wires 150 are formed by a wire bonding process, such that each bonding wire 150 is electrically connected between a first bonding pad 116 and a second bonding pad 136. The bonding wires 150 are, for example, Au wires.

In the present embodiment, the adhesive layer 140 is a B-staged adhesive layer, for example. The B-staged adhesive layer can be obtained from 8008 or 8008HT of ABLESTIK. Additionally, the B-staged adhesive layer can also be obtained from 6200, 6201 or 6202C of ABLESTIK, or obtained from SA-200-6, SA-200-10 provided by HITACHI Chemical CO., Ltd. In an embodiment of the present invention, the B-staged adhesive layer 140 is formed on the active surface of a wafer. When the wafer is separated, a plurality of chip 130 having the adhesive layer 140 on the active surface 132 thereof is obtained. Therefore, the B-staged adhesive layer 140 is favorable to mass production. Additionally, the B-staged adhesive layer 140 may be formed by spin-coating, printing, or other suitable processes. More specifically, the adhesive layer 140 is formed on the active surface 132 of the chip 130 in advance. Specifically, a wafer having a plurality of chip 130 arranged in an array is first provided. Then, a two-stage adhesive layer is formed over the active surface 132 of the chip 130 and is partially cured by heating or UV irradiation to form the B-staged adhesive layer 140. Sometimes, the B-staged adhesive layer 140 could be formed on the patterned conductive layer 110' before the chip 130 being attached on the patterned conductive layer 110'.

In the present embodiment, the B-staged adhesive layer 140 is fully cured after the chip 130 being attached to the patterned conductive layer 110' or being encapsulated by the molding compound 160. In another embodiment of the present invention, the B-staged adhesive layer 140 may be fully cured by a post curing process.

Figure 1D:
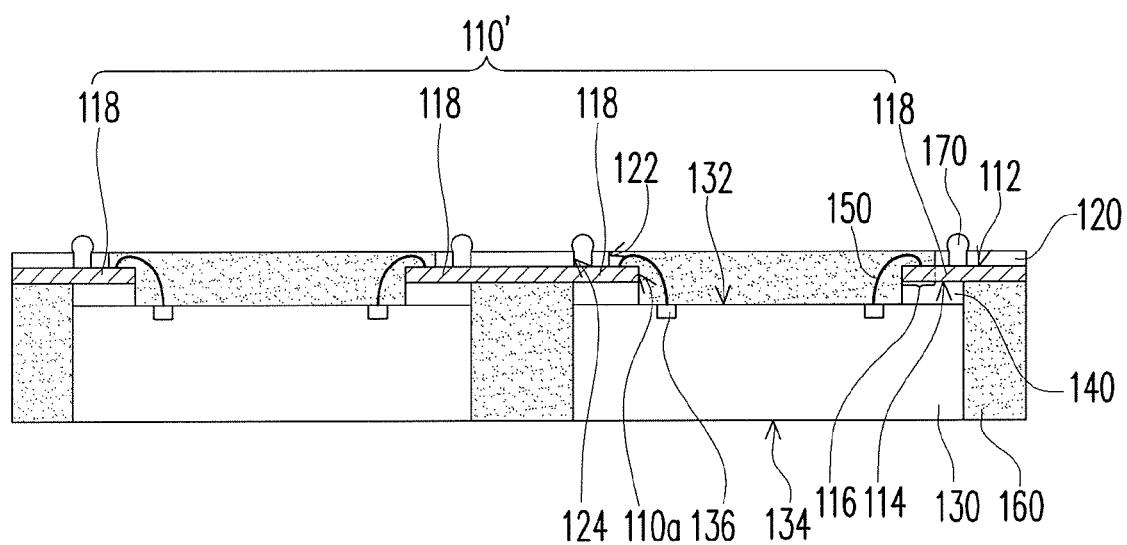

Referring to FIG. 1D, a molding compound 160 encapsulating the patterned conductive layer 110', the patterned solder resist layer 120, the chip 130 and the bonding wires 150 is formed. The material of the molding compound 160 is, for example, epoxy resin. A plurality of outer terminals 170 are then formed in the third openings 122 so as to electrically connect to the patterned conductive layer 110'. The outer terminals 170, for example, are solder balls.

Figure 1E:
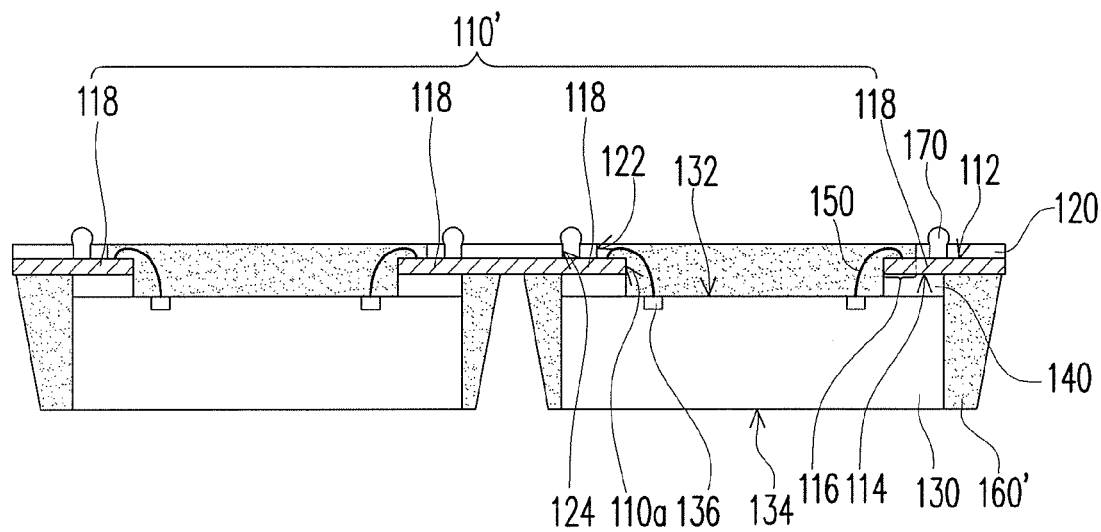

Referring to FIG. 1E, instead of forming a molding compound 160 encapsulating the patterned conductive layer 110', the patterned solder resist layer 120, the chip 130 and the bonding wires 150, a plurality of molding compound 160' could be formed to encapsulate the patterned conductive layer 110', the patterned solder resist layer 120, the chip 130 and the bonding wires 150.

Figure 1F:
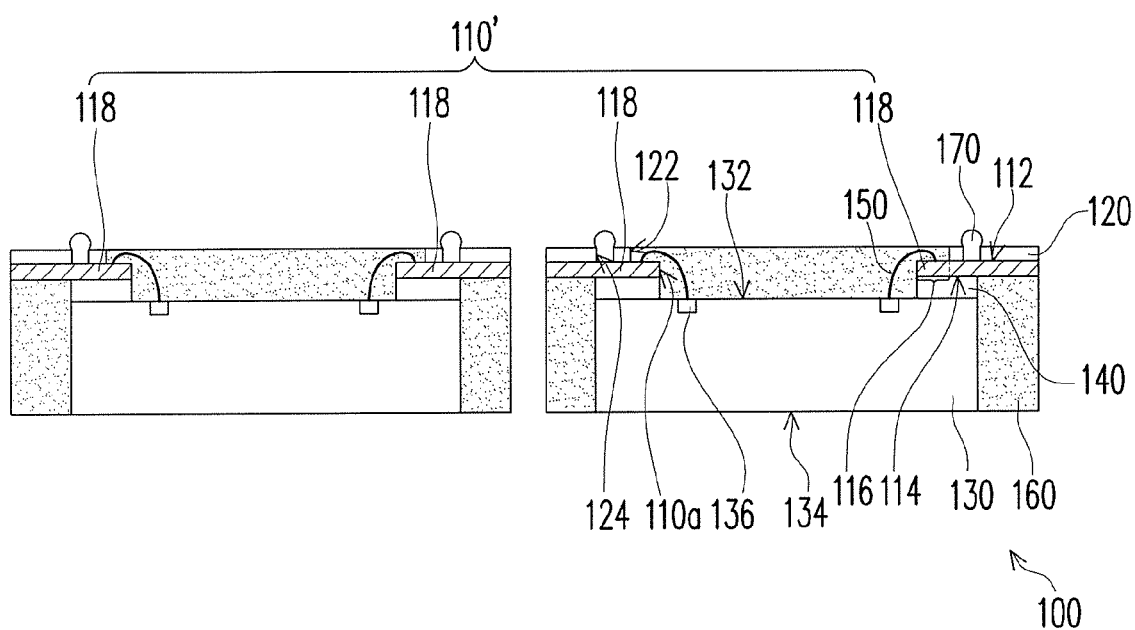
Figure 1G:
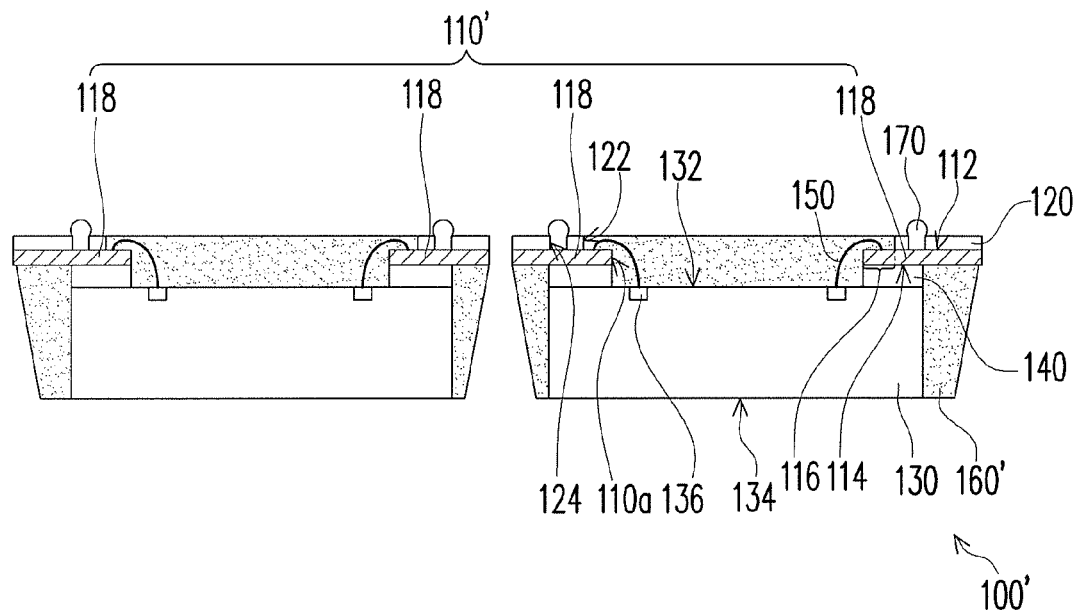

Referring to FIG. 1F and FIG. 1G, the structure shown in FIG. 1D or the structure shown in FIG. 1E is singularized for forming a plurality of chip packages 100 (shown in FIG. 1F) or a plurality of chip packages 100' (shown in FIG. 1G), wherein the singulation process comprises a punch process or a sawing process.

Figure 1H:
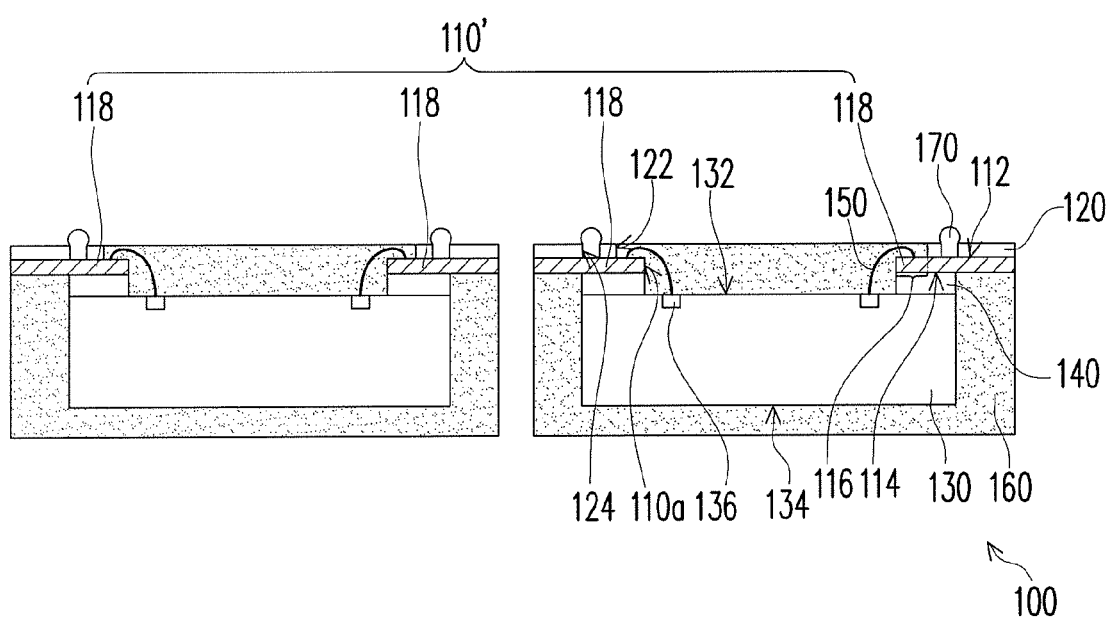

Although the chip 130 is partially encapsulated by the molding compound 160 and the rear surface 134 is exposed, it is clear that the chip 130 can be entirely encapsulated by the molding compound. 160, as shown in FIG. 1H.

As shown in FIG. 1F, the chip package 100 of the present invention mainly includes a patterned conductive layer 110', a patterned solder resist layer 120, a chip 130, a plurality of bonding wires 150 and a molding compound 160. The patterned conductive layer 110' has a first surface 112 and a second surface 114 opposite to each other. The patterned solder resist layer 120 is disposed on the first surface 112, wherein a part of the first surface 112 is exposed by the patterned solder resist layer 120. The chip 130 is disposed on the patterned conductive layer 110'. The bonding wires 150 are electrically connected to the chip 130 and the patterned conductive layer 110' exposed by the patterned solder resist layer 120. The molding compound 160 encapsulates the patterned conductive layer 110', the patterned solder resist layer 120, the chip 130 and the bonding wires 150.

Compared with the conventional manufacturing process for a chip package structure, the manufacturing process of the present invention can produce the chip package without core dielectric layer and having thinner thickness. Additionally, the production cost is lowered and the throughput is improved in the present invention.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing process for a chip package structure, comprising:
   providing a patterned conductive layer having a plurality of first openings and a patterned solder resist layer on the patterned conductive layer;
   bonding a plurality of chips onto the patterned conductive layer such that the chips and the patterned solder resist layer are disposed at two opposite surfaces of the patterned conductive layer;
   electrically connecting the chips to the patterned conductive layer by a plurality of bonding wires passing through the first openings of the patterned conductive layer;
   forming at least one molding compound to encapsulate the patterned conductive layer, the patterned solder resist layer, the chips and the bonding wires; and
   separating the molding compound, the patterned conductive layer and the patterned solder resist layer.

2. The manufacturing process for a chip package structure as claimed in claim 1, wherein a method for providing the patterned conductive layer and the patterned solder resist layer comprises:
   providing a conductive layer;
   forming a solder resist layer on the conductive layer;
   patterning the solder resist layer to form the patterned solder resist layer, wherein a part of the conductive layer is exposed by the patterned solder resist layer; and
   patterning the conductive layer to form the patterned conductive layer.

3. The manufacturing process for a chip package structure as claimed in claim 1, wherein a method for providing the patterned conductive layer and the patterned solder resist layer comprises:
   providing a solder resist layer;
   forming a conductive layer on the solder resist layer;
   patterning the solder resist layer to form the patterned solder resist layer, wherein a part of the conductive layer is exposed by the patterned solder resist layer; and
   patterning the conductive layer to form the patterned conductive layer.

4. The manufacturing process for a chip package structure as claimed in claim 1, wherein a method for providing the patterned conductive layer and the patterned solder resist layer comprises:
   providing a conductive layer;
   forming a solder resist layer on the conductive layer;
   patterning the conductive layer to form the patterned conductive layer; and
   patterning the solder resist layer to form the patterned solder resist layer, wherein a part of the patterned conductive layer is exposed by the patterned solder resist layer.

5. The manufacturing process for a chip package structure as claimed in claim 1, wherein a method for providing the patterned conductive layer and the patterned solder resist layer comprises:
   providing a solder resist layer;
   forming a conductive layer on the solder resist layer;
   patterning the conductive layer to form the patterned conductive layer; and
   patterning the solder resist layer to form the patterned solder resist layer, wherein a part of the patterned conductive layer is exposed by the patterned solder resist layer.

6. The manufacturing process for a chip package structure as claimed in claim 1, wherein a plurality of leads are formed on the patterned conductive layer.

7. The manufacturing process for a chip package structure as claimed in claim 1, wherein a plurality of second openings are formed on the patterned solder resist layer, wherein a part of the patterned conductive layer and a part of each of the chips are exposed by the second openings.

8. The manufacturing process for a chip package structure as claimed in claim 1, wherein a plurality of third openings are formed on the patterned solder resist layer.

9. The manufacturing process for a chip package structure as claimed in claim 8, further comprising forming an outer terminal in each of the third openings and then electrically connecting the outer terminals to the patterned conductive layer through the third openings.

10. The manufacturing process for a chip package structure as claimed in claim 1, further comprising forming an adhesive layer between the chips and the patterned conductive layer.

11. The manufacturing process for a chip package structure as claimed in claim 10, wherein the adhesive layer is a B-staged adhesive layer.

12. The manufacturing process for a chip package structure as claimed in claim 11, wherein the B-staged adhesive layer is formed on a rear surface of the chip in advance.

13. The manufacturing process for a chip package structure as claimed in claim 11, wherein the B-staged adhesive layer is formed on the patterned conductive layer before the chip is attached on the patterned conductive layer.

14. The manufacturing process for a chip package structure as claimed in claim 1, wherein the chip is partially encapsulated by the molding compound.

15. The manufacturing process for a chip package structure as claimed in claim 1, wherein the chip is entirely encapsulated by the molding compound.

* * * * *